United States Patent
Yan et al.

(10) Patent No.: US 10,650,957 B1
(45) Date of Patent: May 12, 2020

(54) ADDITIVE DEPOSITION LOW TEMPERATURE CURABLE MAGNETIC INTERCONNECTING LAYER FOR POWER COMPONENTS INTEGRATION

(71) Applicant: Texas Instruments Incorporated, Dallas, TX (US)

(72) Inventors: Yi Yan, Sunnyvale, CA (US); Luu Thanh Nguyen, San Jose, CA (US); Ashok Prabhu, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/176,630

(22) Filed: Oct. 31, 2018

(51) Int. Cl.
| | |
|---|---|
| H01F 27/26 | (2006.01) |
| H01F 27/40 | (2006.01) |
| H01L 23/495 | (2006.01) |
| H01L 23/00 | (2006.01) |
| H01F 27/28 | (2006.01) |
| H01F 41/24 | (2006.01) |
| H01L 23/66 | (2006.01) |
| H01L 23/31 | (2006.01) |

(52) U.S. Cl.
CPC ....... *H01F 27/266* (2013.01); *H01F 27/2804* (2013.01); *H01F 27/40* (2013.01); *H01F 41/24* (2013.01); *H01L 23/49575* (2013.01); *H01L 23/49589* (2013.01); *H01L 23/66* (2013.01); *H01L 24/48* (2013.01); *H01F 2027/2819* (2013.01); *H01L 23/3107* (2013.01); *H01L 2223/6666* (2013.01); *H01L 2224/48177* (2013.01); *H01L 2224/48195* (2013.01)

(58) Field of Classification Search
None
See application file for complete search history.

(56) References Cited

U.S. PATENT DOCUMENTS

| | | | |
|---|---|---|---|
| 8,450,151 B1 | 5/2013 | Poddar et al. | |
| 8,716,830 B2 | 5/2014 | Poddar et al. | |
| 9,663,357 B2 | 5/2017 | Mao et al. | |
| 9,688,530 B2 | 6/2017 | Shibuya et al. | |
| 2009/0278647 A1* | 11/2009 | Buswell | H01F 3/06 336/182 |
| 2013/0127008 A1 | 5/2013 | Poddar et al. | |
| 2013/0127043 A1 | 5/2013 | Poddar et al. | |
| 2013/0127044 A1 | 5/2013 | Poddar et al. | |
| 2015/0008566 A1 | 1/2015 | Gerber et al. | |

(Continued)

OTHER PUBLICATIONS

Park et al., "Ferrite-Based Integrated Planar Inductors and Transformers Fabricated at Low Temperatures", IEEE Transactions on Magnetics, vol. 33, No. 5, Sep. 1997, 3 pages.

(Continued)

*Primary Examiner* — Asok K Sarkar
(74) *Attorney, Agent, or Firm* — Ronald O. Neerings; Charles A. Brill; Frank D. Cimino

(57) ABSTRACT

Apparatus to form a transformer, an inductor, a capacitor or other passive electronic component, with patterned conductive features in a lamination structure, and one or more ferrite sheets or other magnetic core structures attached to the lamination structure via one or more inkjet printed magnetic adhesive layers that join the magnetic core structure or structures to the lamination structure.

23 Claims, 11 Drawing Sheets

(56) References Cited

U.S. PATENT DOCUMENTS

| | | |
|---|---|---|
| 2015/0069572 A1 | 3/2015 | Khanolkar et al. |
| 2015/0143690 A1 | 5/2015 | Poddar |
| 2015/0147845 A1 | 5/2015 | Poddar et al. |
| 2016/0163451 A1* | 6/2016 | Wang .................... H01F 41/042 336/192 |
| 2016/0347607 A1 | 12/2016 | Shibuya et al. |
| 2017/0015548 A1 | 1/2017 | Mao et al. |
| 2017/0125324 A1 | 5/2017 | Joshi et al. |
| 2017/0253476 A1 | 9/2017 | Shibuya et al. |
| 2018/0040420 A1 | 2/2018 | Poddar |
| 2018/0205135 A1* | 7/2018 | Takashima ........... H01Q 1/2291 |
| 2018/0301402 A1 | 10/2018 | Morroni et al. |
| 2018/0301403 A1 | 10/2018 | Morroni et al. |
| 2018/0301404 A1 | 10/2018 | Morroni et al. |
| 2018/0350507 A1* | 12/2018 | Matsubayashi ..... H01F 17/0013 |

OTHER PUBLICATIONS

Brandon et al., "Printed Microinductors on Flexible Substrates for Power Applications", IEEE Transactions on Components and Packaging Technologies, vol. 26, No. 3, Sep. 2003, 7 pages.

* cited by examiner

ADDITIVE DEPOSITION LOW TEMPERATURE CURABLE MAGNETIC INTERCONNECTING LAYER FOR POWER COMPONENTS INTEGRATION

BACKGROUND

High quality isolation transformers typically are wire wound transformers, which are large and expensive. To shrink the size of such transformers, while keeping high isolation rating is very challenging for smaller footprint designs. There is a big demand for a small, affordable isolation transformer which would be better suited for module integration. Currently, many transformer structure designs can meet these requirements. The planar transformer structure, the planar transformer structure with a center post, as well as EI, UI, and TU-shaped transformers structures, have very high coupling, inductance density and quality factor. However, the transformer core pieces are interconnected by dispensing non-magnetic materials on the laminates for electrical connection. This method will generate "gaps" of 20-25 um thickness between magnetic pieces and laminate winding structures, which has adverse impact on the efficiency and properties of the transformer structures. Better solutions are needed for improved high frequency operation and low-cost manufacturing of planar passive component structures.

SUMMARY

Described examples provide apparatus that includes one or more patterned conductive features on laminate sheets of a lamination structure, and an inkjet printed magnetic adhesive layer that attaches a core structure to the lamination structure.

In one example, the core structure includes a magnetic material. In one example, an apparatus includes a lamination structure with a patterned conductive feature, a core structure, such as a magnetic sheet, and a magnetic adhesive layer that joins the core structure to the lamination structure. In one implementation, the lamination structure includes multiple patterned conductive features, for example, on different patterned conductive layers of a multilayer lamination structure. The apparatus in one example includes multiple core structures, such as top and bottom magnetic sheets, attached to different sides of the lamination structure using inkjet printed magnetic adhesive layers. In one example, the lamination structure includes a conductive primary winding, and a conductive secondary winding that is magnetically coupled with the conductive primary winding by the core structure and the magnetic adhesive layer. In one example, the passive electronic component is an inductor, and the lamination structure includes a conductive winding that is magnetically coupled with the core structure and the magnetic adhesive layer. In one example, the passive electronic component is a capacitor, and the lamination structure includes first and second capacitor plates.

Further described examples provide processes or methods for fabricating an apparatus. The method in one example includes performing an inkjet printing process that prints a magnetic ink epoxy on a magnetic core structure, or on a lamination structure, and attaching the magnetic core structure to the lamination structure via the magnetic ink epoxy. One example also includes performing another inkjet printing process that prints a second magnetic ink epoxy on the lamination structure, and attaching a second magnetic core structure to the lamination structure via the second magnetic ink epoxy.

DETAILED DESCRIPTION

Figure 1:
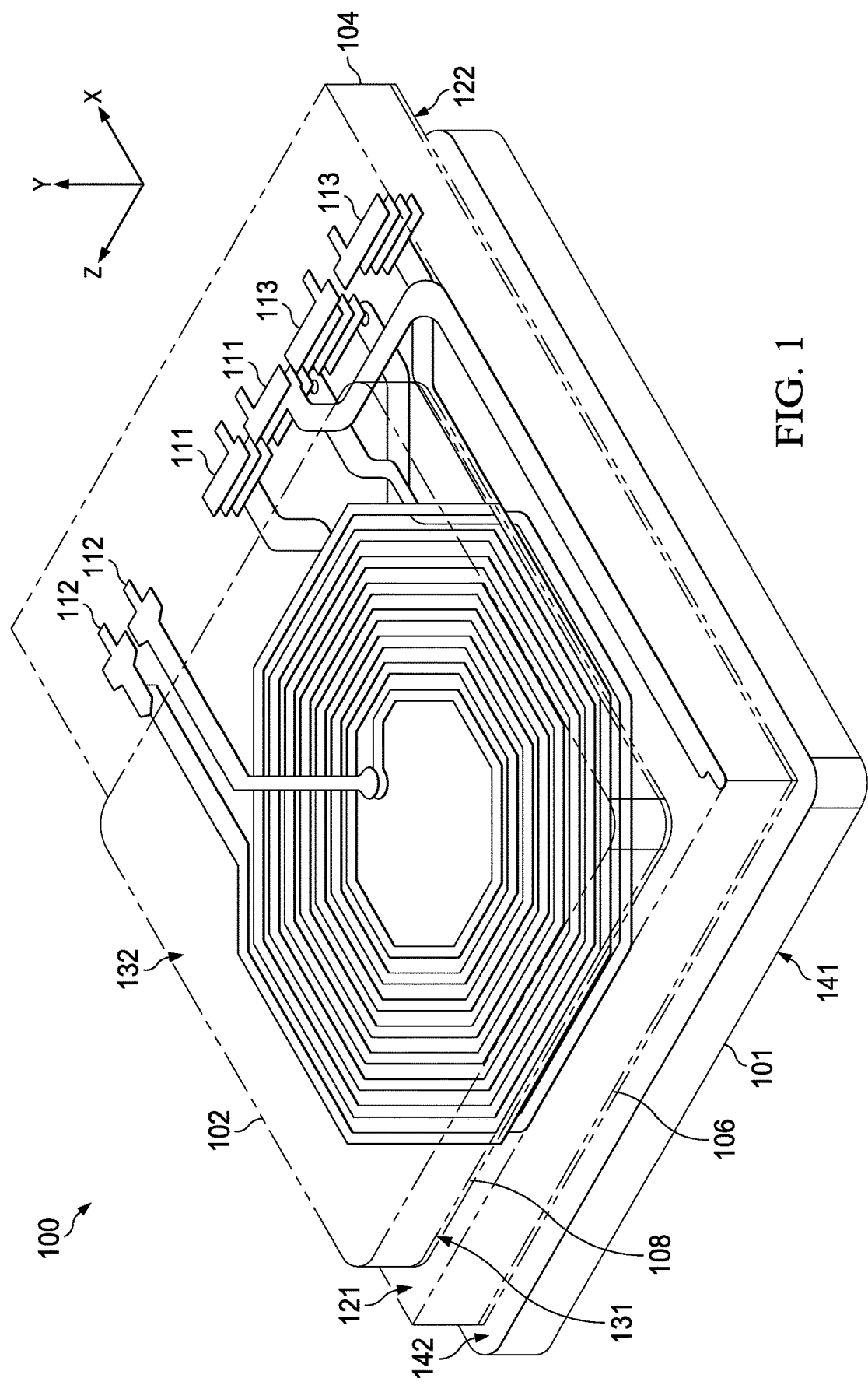
FIG. 1 is a perspective view of an example transformer apparatus with a multilayer lamination structure and upper and lower core structures attached to the lamination structure by magnetic ink epoxy.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
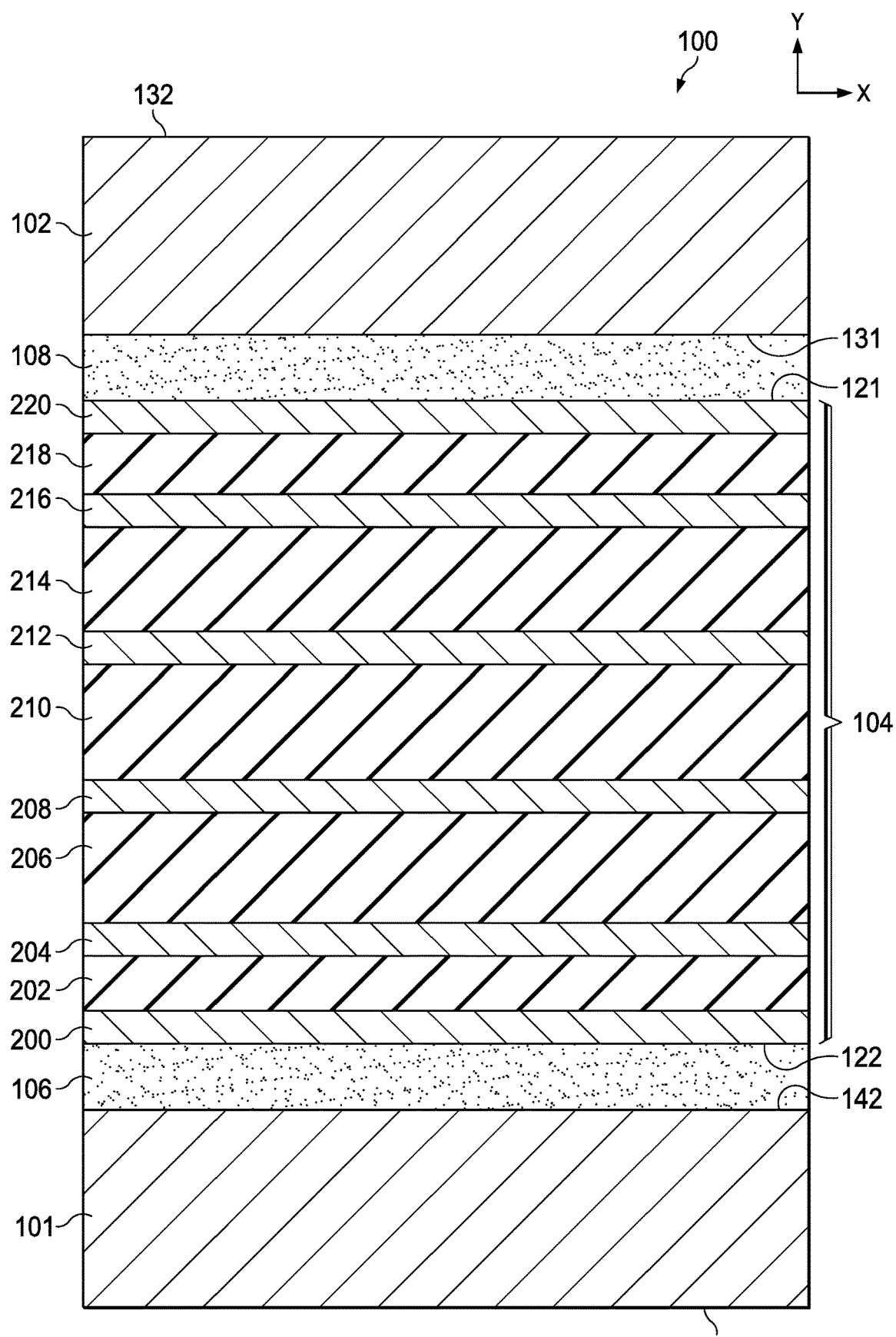
FIG. 2 is a partial sectional side elevation view of the transformer apparatus of FIG. 1.

FIGS. 1 and 2 show an isolation transformer apparatus 100. The apparatus 100 includes a first core structure 101, a second core structure 102 and a lamination structure 104. The lamination structure 104 and the core structures 101, 102 are generally planar in the illustrated example, although not required for all implementations. The lower first core structure 101 is attached to at least a portion of the bottom side of the lamination structure 104 via a first magnetic adhesive layer 106, and the upper second core structure 102 is attached to at least a portion of the top side of the lamination structure 104 via a second magnetic adhesive layer 108.

Figure 12:
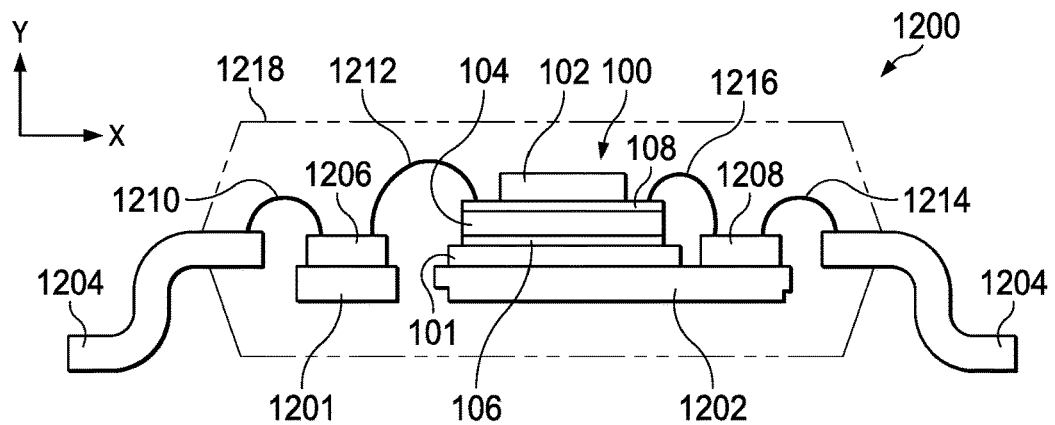
FIGS. 12 and 13 respectively show side elevation and top plan views of a packaged semiconductor product with a transformer apparatus with a multilayer lamination structure and upper and lower core structures attached to the lamination structure by magnetic ink epoxy.
Figure 13:
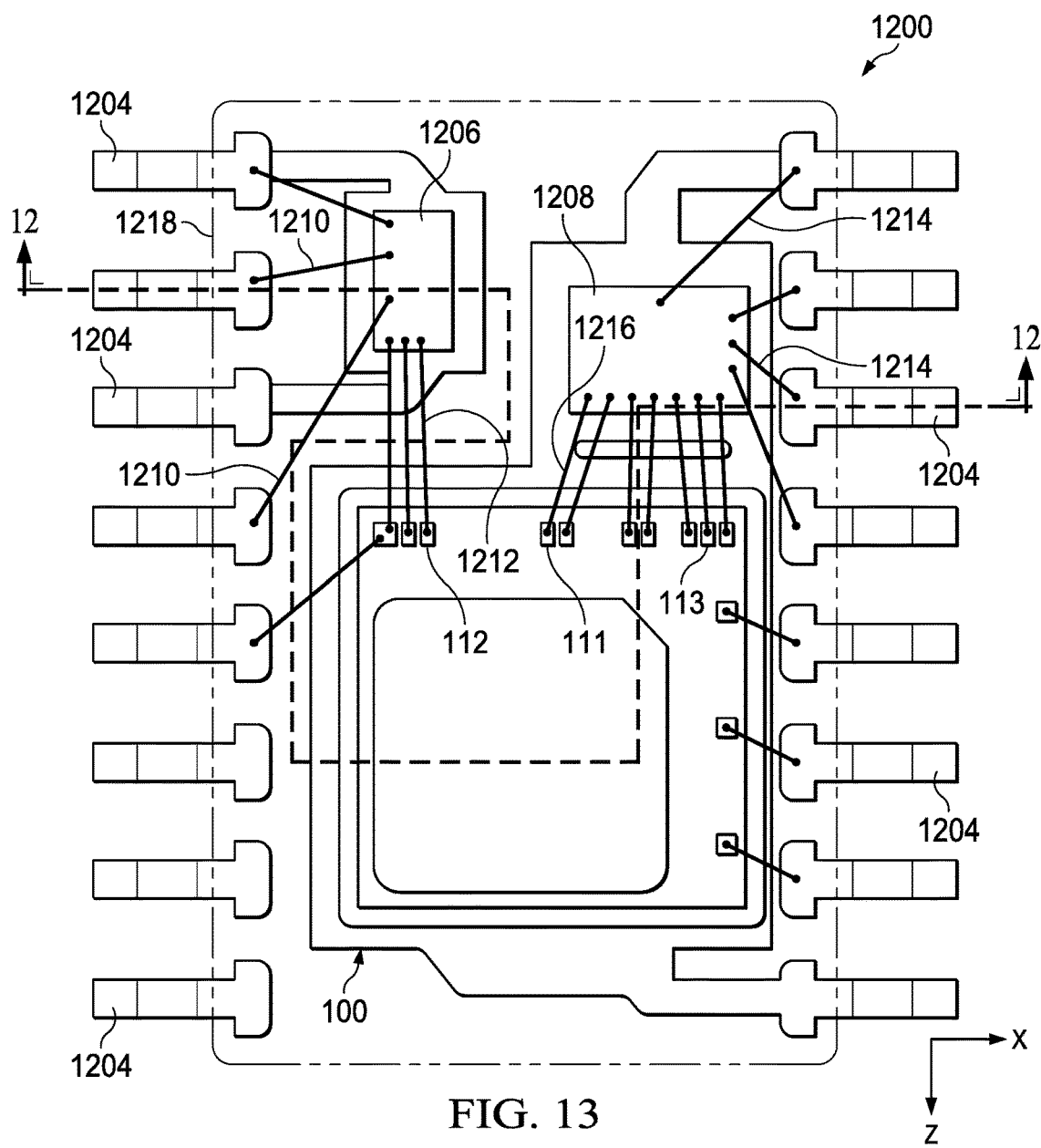

The lamination structure 104 in one example is a multilayer structure with patterned conductive features 111, 112 and 113 that form parts of a passive transformer electronic component. In one example, a first patterned conductive feature 111 forms a transformer primary winding, a second patterned conductive feature 112 forms a first transformer secondary winding, and the patterned conductive feature 113 forms a second secondary winding. The patterned conductive features 111, 112 and 113 in this example have components on multiple layers of a multilayer lamination structure 104, although not required of all possible implementations. In addition, the patterned winding turns of the individual primary and secondary windings in this example extend on different layers of the lamination structure 104, although not required of all possible implementations. Moreover, the individual patterned winding features 111, 112 and 113 include multiple turns in a spiral pattern on the individual layers of the lamination structure 104, although other implementations are possible, such as single turn winding structures on a single layer. Furthermore, the example patterned conductive features forming the transformer primary and secondary windings include end connection features allowing interconnection of the windings to external circuitry (not shown). In the illustrated example, the individual patterned conductive features 111, 112 and 113 include end connections for external connection of the individual transformer windings, such as for wire bonding connections in a packaged semiconductor product as shown in FIGS. 12 and 13 below. In one example, the magnetic adhesive layers 106 and 108 are inkjet printed using magnetic epoxy ink. In the illustrated example, the upper and lower core structures 101, 102 are attached to the lamination structure by magnetic ink epoxy 106, 108 to form a magnetically coupled transformer apparatus. The magnetic ink epoxy 106, 108 provides magnetic coupling between the windings formed by the patterned conductive features 111, 112 and 113 without an undesirable non-magnetic gap between the lamination structure 104 and the core structures 101 and 102. In other examples, one of the upper or lower core structures 101, 102 and the corresponding magnetic ink epoxy 106, 108 can be omitted, with the remaining core structure and magnetic epoxy providing magnetic coupling for the passive electronic component or components of the apparatus 100. The lamination structure 104 includes a top or first side 121 and a bottom or second side 122. The second core structure 102 includes a bottom or first side 131 that is attached to the first side 121 of the lamination structure 104 via the magnetic adhesive layer 108, and a top or second side 132. The first core structure 101 includes a bottom or first side 141, and a second or top side 142 that is attached to the second side 122 of the lamination structure 104 via the first magnetic adhesive layer 106. The individual core structures (e.g., magnetic sheets) and the lamination structure 104 are attached to one another via mechanical bonding through adhesion provided by the magnetic ink epoxy 106, 108, and may, but need not, contact one another. Where not in direct structural contact, the lamination structure 104 and the core structure(s) are joined by the epoxy material 106, 108 that provides a continuous magnetic structure with enhanced high frequency performance compared to the use of non-magnetic epoxy.

In other transformer examples, the lamination structure includes the primary winding 111 and a single secondary winding, and the further secondary winding 113 can be omitted. In other examples, a single patterned conductive feature can be provided to form a single conductive winding of an inductor, and the inductor winding is magnetically coupled with one or more core structures via magnetic adhesive layer material. In another example, a passive capacitor electronic component can be constructed, in which the lamination structure 104 includes first and second capacitor plates separated by a dielectric material of the multilayer lamination structure.

The inkjet printing of magnetic epoxy ink 106, 108 advantageously provides controlled materials usage during manufacturing, thereby reducing waste and controlling manufacturing cost of the apparatus 100 compared with screen printing. In addition, the magnetic epoxy ink 106, 108 performs the attachment (e.g., bonding or mechanical attachment) function for adhering the core structure or structures 101, 102 to the lamination structure, while mitigating or avoiding the non-magnetic material gap found in other structures manufactured using non-magnetic epoxy. The improved magnetic coupling via the magnetic epoxy ink structures 106, 108 enhances the transformer performance, and facilitates high frequency operation of the transformer component formed by the apparatus 100. The magnetic coupling of the patterned conductive features 111, 112 and 113 with the core structure(s) and/or with one another can be modified for design changes by simply changing the inkjet printing programming for printing the magnetic ink epoxy 106 and/or 108. In one example, the printing programming provides a continuous or solid magnetic ink epoxy layer 106 and/or 108, and the thickness and/or material properties of the material 106, 108 can be varied for a given magnetic coupling design. In other examples, discontinuous patterns of the material 106, 108 can be programmed for inkjet printing to achieve a desired magnetic circuit for a given apparatus design.

In one example, the core structures 101, 102 are magnetic ferrite sheets. Any suitable magnetic material can be used for the core structures 101, 102, including ferrous materials. Any material can be used that can provide a magnetic coupling for one or more patterned conductive features, for example, to create a transformer or an inductor. In one example, the core structures 101, 102 are sheets of ferrous material (e.g., ferrite sheets). In one example, the core structures 101, 102 are a mixture of Bismaleimide-Triazine (BT) epoxy resin. In one example, the first and second magnetic epoxy ink structures 106, 108 include a magnetic paste with magnetic particles mixed in a thermal set polymer matrix, inkjet printed onto one or more sides and/or surfaces of the lamination structure 104 and/or onto one or more sides or surfaces of the core structures 101, 102.

The disclosed approach provides a solution to limited micro-transformer performance because of non-magnetic interconnecting material by selective printing of magnetic ink/epoxy to form the attachment layers 106, 108.

FIG. 2 shows an example multilayer lamination structure 104 in the transformer apparatus 100. The lamination structure 104 includes a first conductive feature 200 on the bottom side of a first laminate layer 202, and the bottom side 122 of the laminate layer, including the conductive feature 200, is attached to the top side 142 of the first core structure 101 via the first magnetic ink epoxy 106. A patterned conductive feature 204 extends on the top side of the laminate layer 202, and a subsequent laminate layer 206 is attached to the top side of the first laminate layer 202 and to the conductive feature 204. A further conductive feature 208 extends on the top side of the laminate layer 206, and a center or core laminate layer 210 is attached to the top side of the laminate layer 206 and the conductive feature 208. Another patterned conductive feature 212 extends on the top side of the center laminate layer 210, and a further laminate layer 214 is attached to the top side of the center laminate layer 210 and the conductive feature 212. Another conductive feature 216 extends on the top side of the laminate layer 212, and a subsequent laminate layer 218 is attached to the top side of the laminate layer 214 and to the conductive feature 216.

In this example, a final conductive feature 220 extends on the top side of the laminate layer 218. The upper second core structure 102 is attached to the uppermost laminate layer 218 and the associated conductive feature 220 via the second magnetic ink epoxy 108 to complete the structure. In one example, the first and second core structures 101 and 102 are 30 µm thick, and the patterned conductive features or layers 200, 204, 208, 212, 216 and 220 include copper with a thickness of 23 µm. In one example, the first magnetic ink epoxy material 106 has a thickness of 20 µm, and the second magnetic ink epoxy material 108 has a thickness of 40 µm. In one example, the center core laminate layer 210 has a thickness of 60 µm, the laminate layers 206 and 214 have thicknesses of 50 µm, and the outermost laminate layers 202 and 218 have thicknesses of 45 µm.

The example of FIGS. 1 and 2 uses a lamination structure 104 with six metal layers to provide the patterned conductive transformer winding features 111, 112 and 113. In one example, the pattern conductive features 208 and 212 in FIG. 2 are used for the patterned primary winding structure 111. The patterned conductive features 216 and 220 are used for the patterned first secondary winding structure 112, and the two lowermost patterned conductive features 200 and 204 are used for the second secondary winding structure 113.

Figure 3:
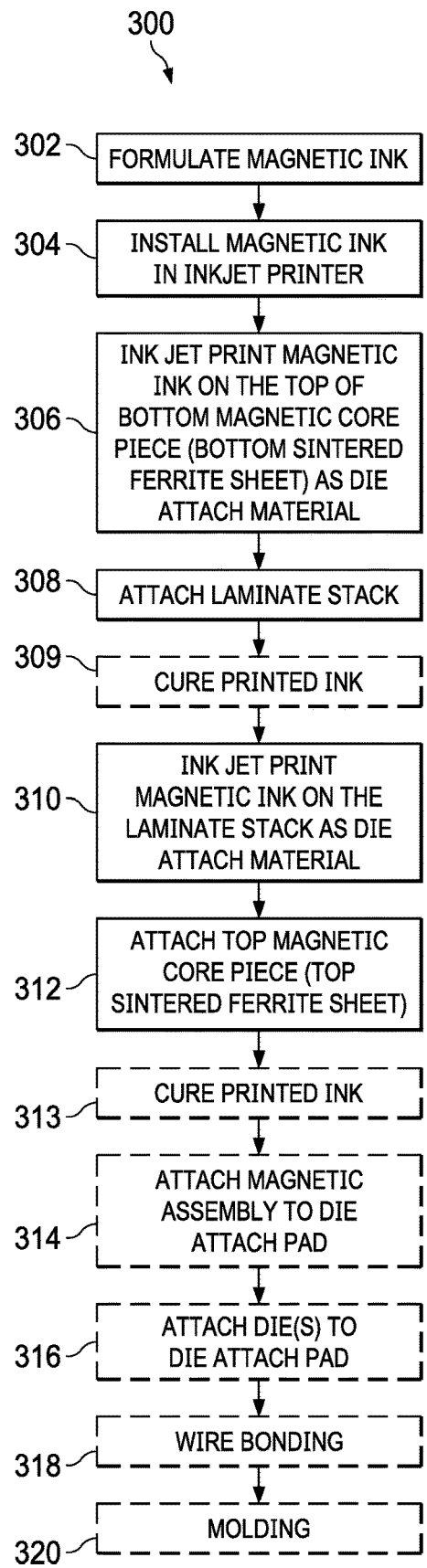
FIG. 3 is a flow chart of a method to fabricate an apparatus.

FIG. 3 shows an example method 300 for fabricating an apparatus with one or more electronic components, such as the apparatus 100 of FIGS. 1 and 2. In one example, the lamination structure 104 is preassembled before the processing 300 is performed. The apparatus 100 can include any type or form of passive electronic component or components, such as capacitors, inductors, resistors, transformers, and hybrid circuits.

The method 300 begins at 302 in FIG. 3 with formulation of the magnetic ink epoxy (e.g., for use in printing the magnetic ink epoxy 106 and 108 in FIGS. 1 and 2). In one example, the magnetic ink epoxy is formulated at 302 as a ferrite film. The formulation at 302 can be tailored to adjust film thickness, adhesive and magnetic material properties for ease of integration with a given apparatus design. In certain implementations, the inkjet printing of the magnetic ink epoxy includes printing multiple layers to provide a desired final layer thickness of the epoxy layers 106 and/or 108. The magnetic ink can be fabricated at 302 using ferrite powders with different particle sizes to vary properties of the structure layer by layer. The same or different magnetic ink epoxy formulations can be used for printing different layers in some examples. The property and thickness adjustability of the method 300 provides significant advantages compared with other dispensing methods, such as screen printing. In one example, the particle size of the magnetic powders is in the range of tens of nanometers to a few hundred nanometers for inkjet printing.

The following table lists three example magnetic adhesive layer pastes, which have varied properties based on the magnetic particle types and sizes, where $B_s$ is the saturation flux density in Tesla units (T), and $\mu$ is the relative permeability of the magnetic particles:

| Magnetic Ink | Magnetic particle properties | Relative permeability | Saturation flux density of magnetic ink (T) | Particle sizes (nm) |
|---|---|---|---|---|
| Finemet in epoxy | $B_s$ = 1 to 1.6 T, $\mu$ = 4,000 to 150,000 @ 1 KHz | 20 | Unknown | 200 |
| Finemet in silicone | $B_s$ = 1 to 1.6 T, $\mu$= 4,000 to 150,000 @ 1 KHz | 200 | Approximately 0.35 (Magnetic) @ 100 MHz | 500 |
| Fe-Metallic glasses in silicone | $B_s$ = 1 to 1.6 T, $\mu$ = 3,000 to 18,000 @ 1 KHz | 12 | Approximately 0.20 (Magnetic) @ 100 MHz | 800 |

At 304, the magnetic ink epoxy is installed in an inkjet printer. In one example, the lamination structure 104 is separately processed before performing the method 300 in FIG. 3.

Figure 4:
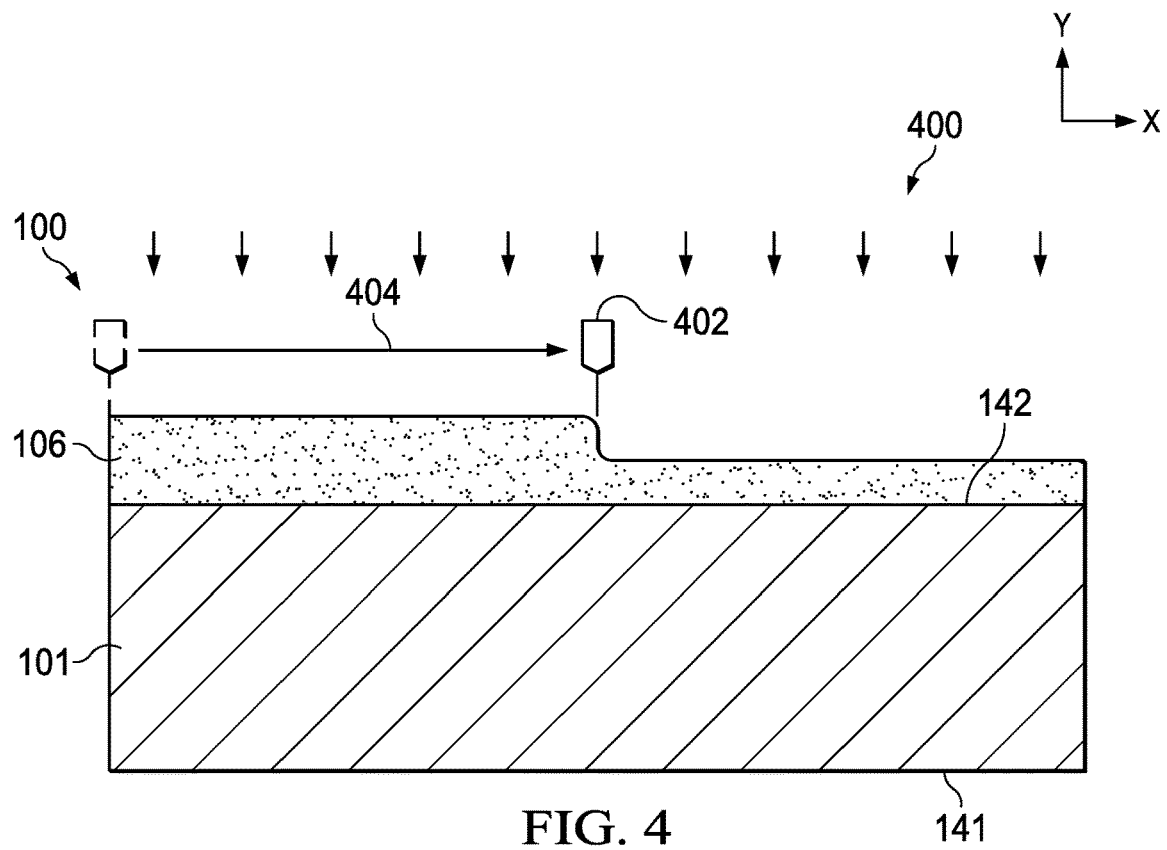
FIGS. 4-11 show the example transformer apparatus of FIGS. 1 and 2 at various stages of fabrication according to the method of FIG. 3.
Figure 5:
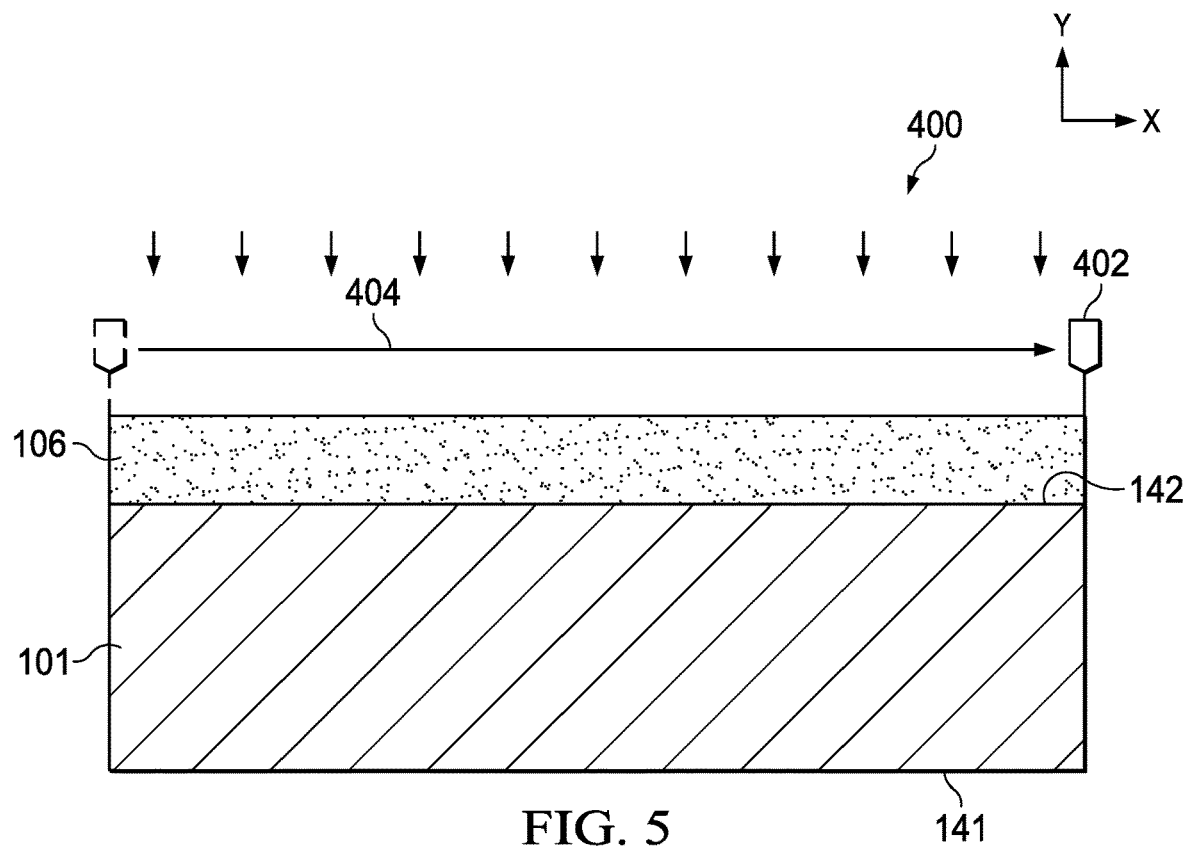
Figure 6:
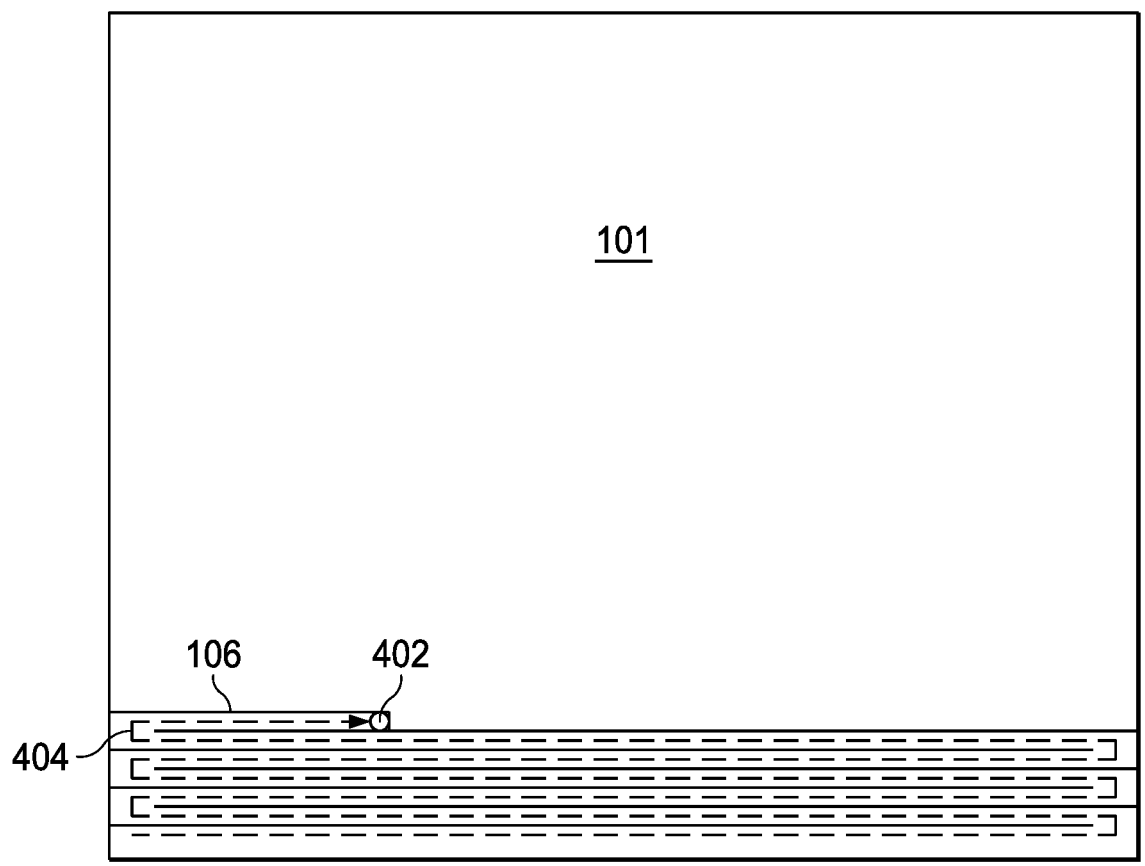

The method 300 includes performing an inkjet printing process at 306 that inkjet prints the magnetic ink epoxy as a die attach material on the top side of the first magnetic core structure (e.g., the first core structure 101, such as a sintered ferrite sheet). FIGS. 4-6 show an example inkjet printing process 400 that prints the first magnetic adhesive layer 106 on the second side 142 of the first core structure 101. In one example, a multi-layer printing process 400 is used as shown in FIGS. 4-6 to form the first magnetic ink epoxy 106. FIG. 4 illustrates the process 400 using an inkjet print head 402 traveling along a programmed or predetermined pattern path 404. FIG. 5 illustrates the completion of the first inkjet print process 400 to complete the first magnetic ink epoxy layer 106. FIG. 6 shows a top view of the inkjet printing process 400 as the print head 402 is traversed along a raster printing path 404 beginning in the lower left, and printing a series of connected rows (e.g., along the X direction) on the top surface of the first magnetic core structure 101. In one example, the pattern substantially covers the entire top surface of the first core structure 101 in which the lamination structure 104 will be attached. In other examples, different patterns can be used for inkjet printing the first magnetic adhesive layer 106.

Figure 7:
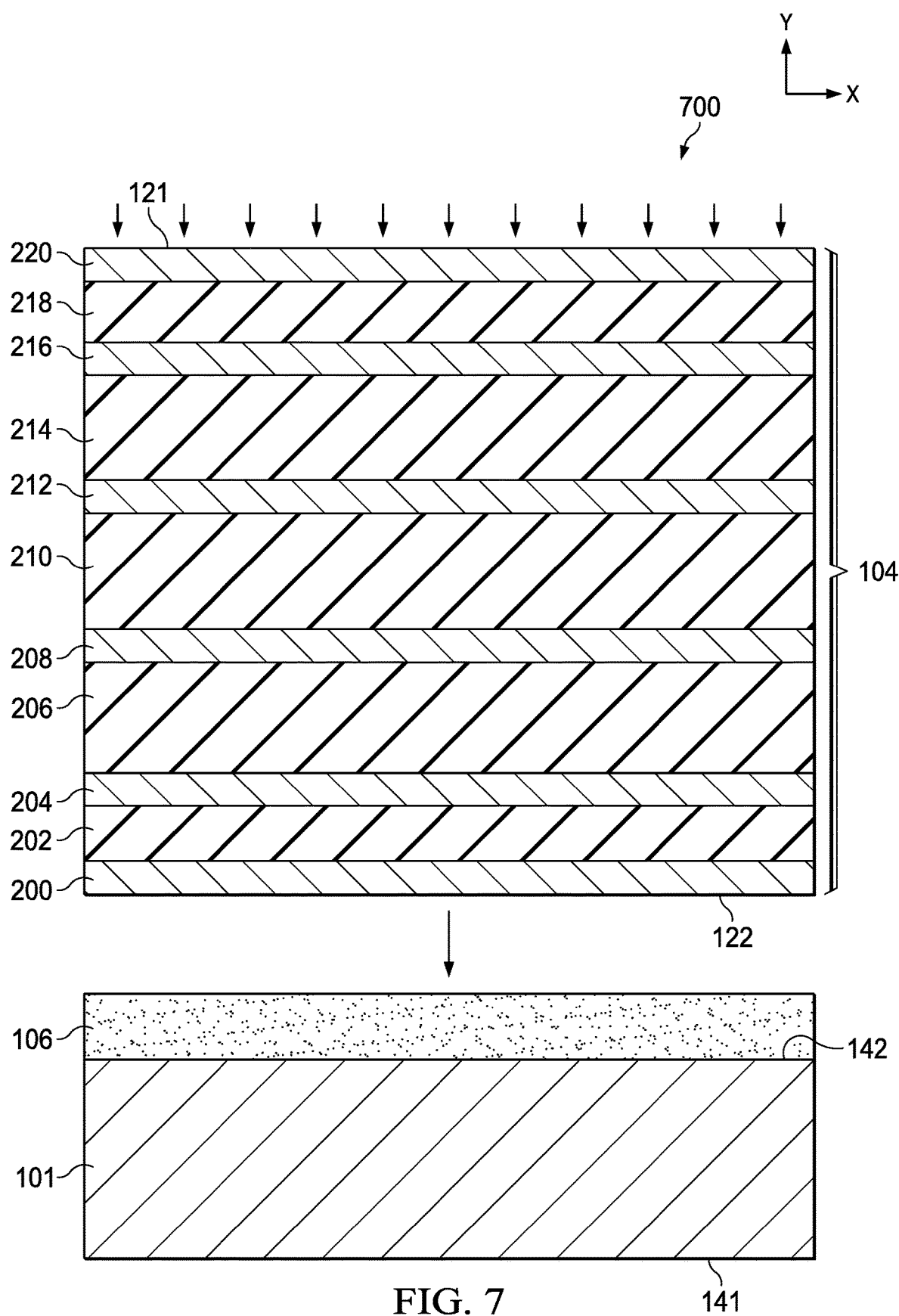
Figure 8:
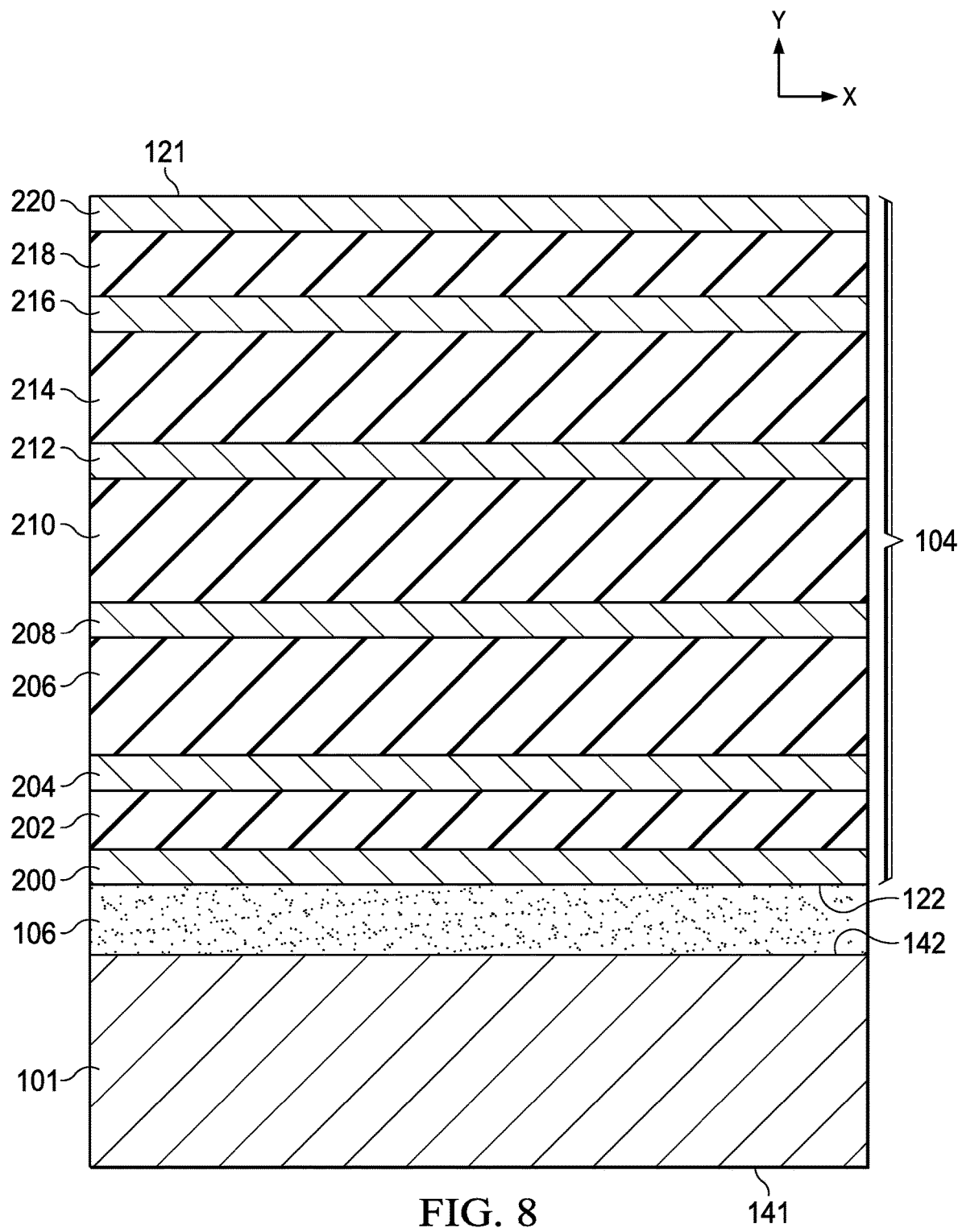

At 308 in FIG. 3, the bottom side of the lamination structure 104 is attached to the top side of the first magnetic core structure 101 via the printed ink epoxy 106. FIGS. 7 and 8 show an example attachment process 700 in which the lower or second side 122 of a preassembled lamination structure 104 is initially brought downward in FIG. 7 toward the upper or second side 142 of the first core structure 101 (e.g., along the negative Y direction), and then the magnetic ink epoxy 106 bonds the lower side 122 of the lamination structure 104 to the upper side 142 of the first core structure 101 as shown in FIG. 8. In one example, the printed first magnetic ink epoxy layer 106 is cured at 309, for example, by heating the printed material 106, or by ultraviolet (UV) exposure of UV-curable material 106, or by other suitable curing means. In other examples, the separate curing at 309 can be omitted.

Figure 9:
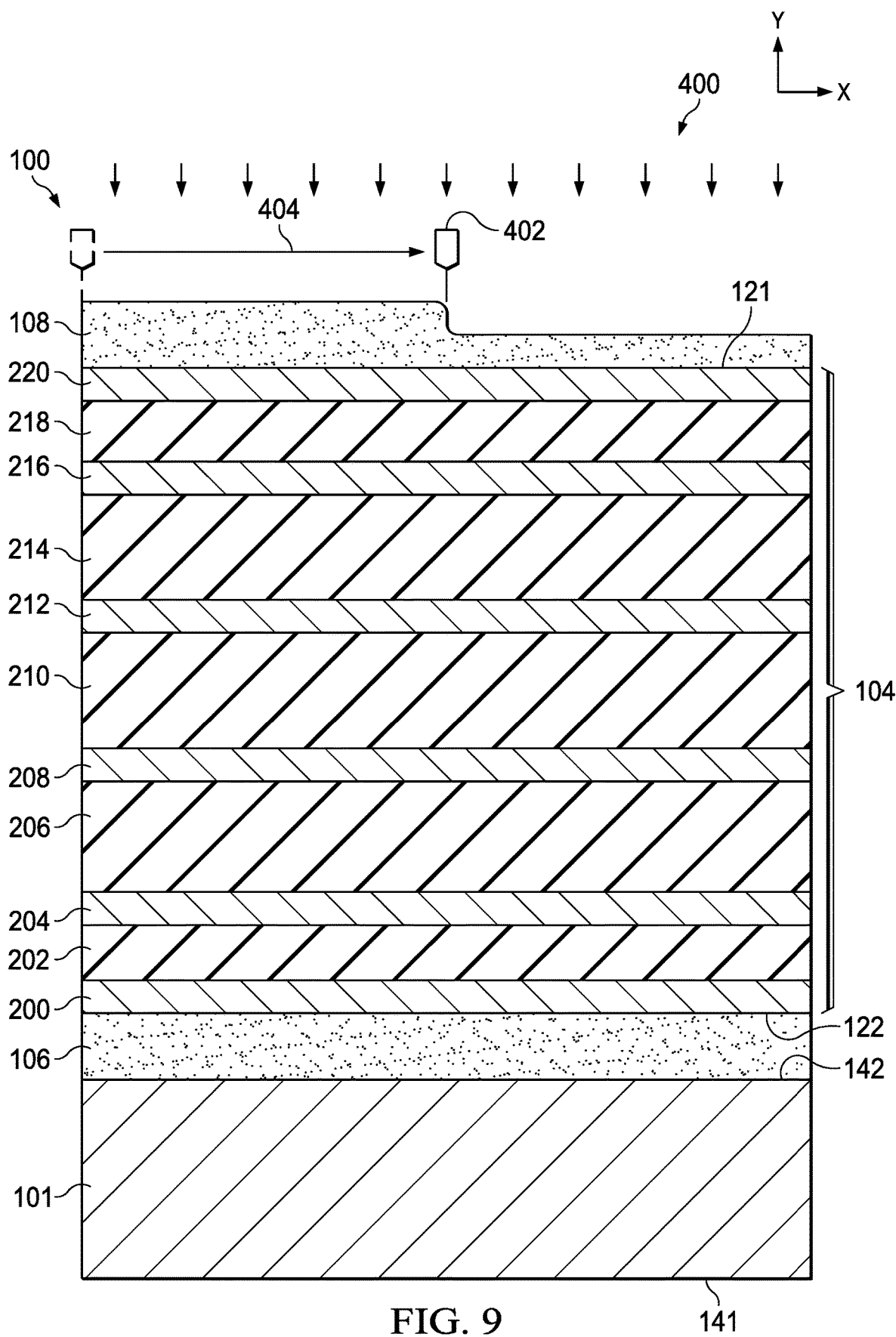
Figure 10:
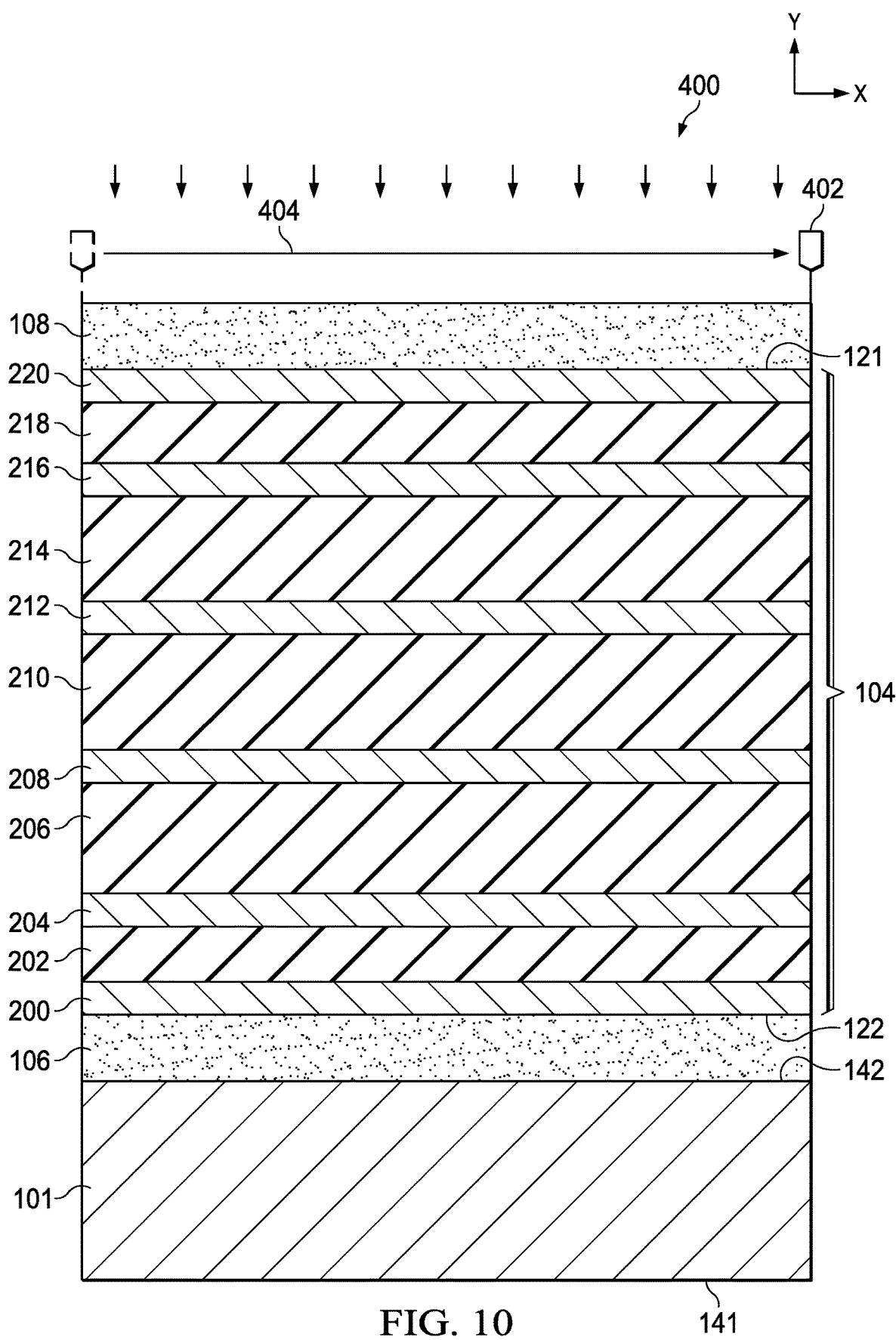

At 310 in FIG. 3, the method 300 further includes inkjet printing another magnetic ink epoxy as a die attach material on the lamination structure. FIGS. 9 and 10 show an example where the inkjet printing process 400 is again performed, this time to form the second magnetic ink epoxy 108 on the upper first side 121 of the lamination structure 104. In this example, a multi-layer inkjet printing process 400 is used, although not a requirement of all possible implementations.

Figure 11:
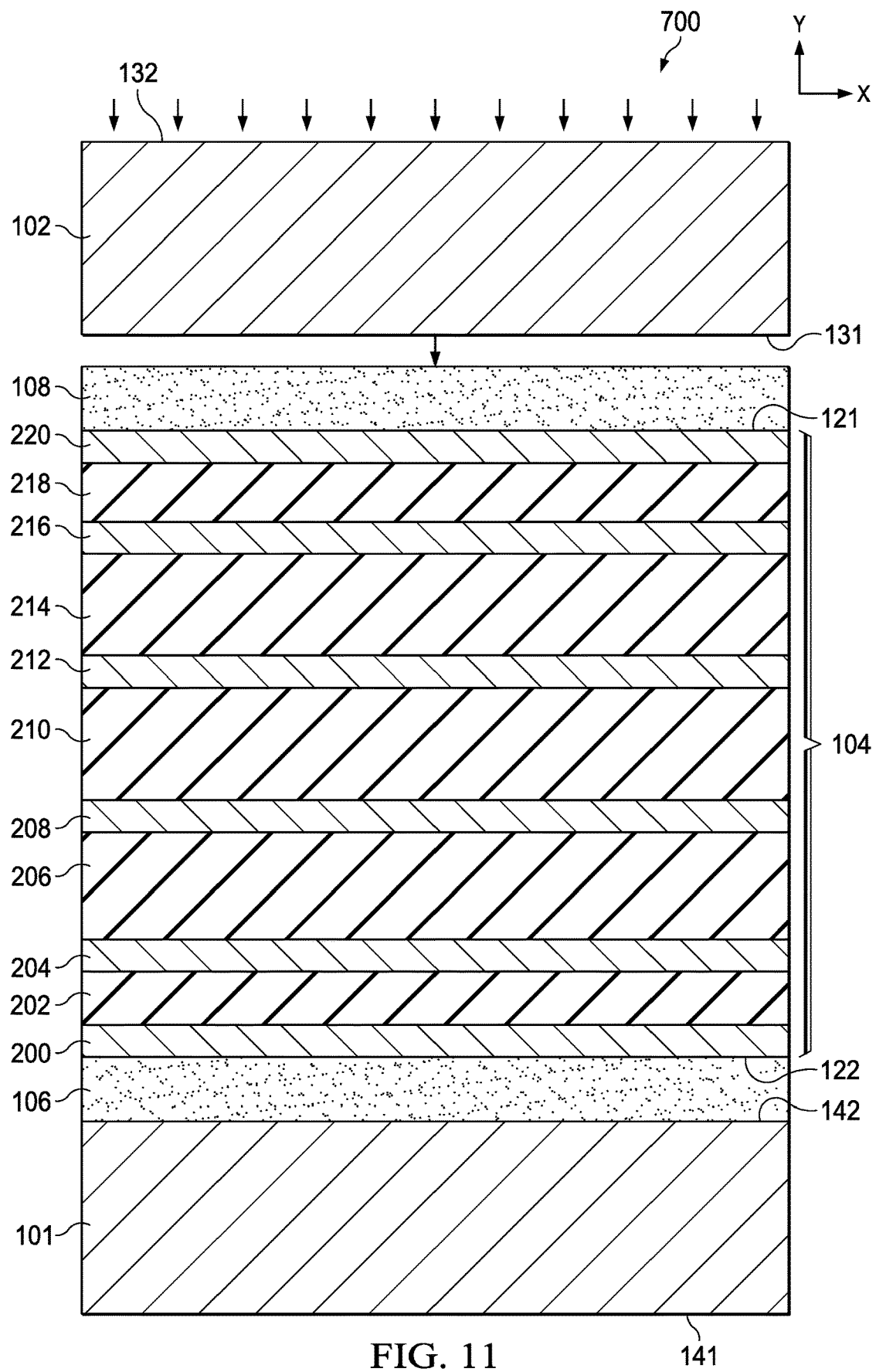

At 312 in FIG. 3, the second magnetic core structure 102 is attached to the top side of the lamination structure via the printed second ink epoxy. FIG. 11 shows an example second attachment process 700, which attaches the upper second magnetic core structure 102 to the upper first side 121 of the lamination structure 104 via the printed second magnetic ink epoxy 108. In one example, the completed structure is then heated (e.g., co-fired) at 313 to cure the inkjet printed magnetic ink epoxy 108 (and 106, if previously uncured). This provides the transformer apparatus example 100 as shown in FIGS. 1 and 2 above, with no non-magnetic gaps between the lamination structure 104 and the core structures 101 and 102.

In one example, the method 300 further provides a complete process for manufacturing a package semiconductor device that includes the example transformer apparatus 100 or other integrated magnetic apparatus. In this example, the method 300 further includes attaching the magnetic assembly (e.g., the transformer apparatus 100) to one or more die attach pads at 314, as well as attaching one or more semiconductor dies to the die attach pad at 316.

At 318, the semiconductor product fabrication example further includes electrical interconnection of one or more external conductive features of a lead frame or other package structure with one or more conductive features of the attached semiconductor die or dies, and conductive features of the magnetic assembly. In one example, the interconnection includes wire bonding at 318. In other examples, the interconnection can include soldering, such as in a flip-chip product fabrication, or various structural interconnections in forming a wafer chip scale packages (WCSP). At 320, the interconnected assembly is enclosed at least partially within a package structure, such as by molding portions of the assembly, while leaving leads or other conductive features exposed for ultimate soldering to an external structure, such as a printed circuit board.

FIGS. 12 and 13 show side elevation and top plan views of a packaged semiconductor product 1200 with a transformer apparatus 100 as described above in connection with FIG. 1, including a multilayer lamination structure 104, as well as a lower core structure 101 and an upper core structure 102 attached to the lamination structure 104 by magnetic ink epoxy 106, 108. The packaged product 1200 includes a first die attach pad 1201 and a second die attach pad 1202. A lead frame structure is provided, including leads 1204 extending outside the product for external connection, such as soldering to a circuit board (not shown). The illustrated example includes gull wing leads, but j-type or other leads or external connections can be provided in other implementations. A first semiconductor die 1206 is mounted on the first die attach pad 1201, and a second semiconductor die 1208 is mounted on the second die attach pad 1202. In this example, the transformer apparatus 100 is also mounted to the second die attach pad 1202. The example semiconductor product 1200 in FIGS. 12 and 13 is a wire-bonded device, although flip-chip, wafer chip scale packages (WCSP), or other designs are possible in different implementations. In the illustrated example, the product 1200 includes bond wires 1210, 1212, 1214 and 1216 interconnecting various conductive features.

The illustrated example provides a high voltage circuitry including the first semiconductor die 1206 and associated leads 1204 on the left side of the product 1200. The product 1200 in this example also includes low voltage circuitry including the second semiconductor die 1208 and associated leads 1204 on the right side of the product 1200. In one example, the product 1200 is a DC-DC converter, in which the first semiconductor die 1206 includes a switch configured to perform primary-side switching of a DC input voltage. In certain examples, the first semiconductor die 1206 also includes control circuitry to provide a switching control signal to operate the switch. The second semiconductor die 1208 in one example includes one or more rectifier diodes configured for secondary-side rectification to provide a DC output signal. In one example, the second semiconductor die 1208 further includes one or more additional electronic components, such as an output capacitor. In this example, the bond wires 1210 connect high-voltage side leads 1204 to the first semiconductor die 1206, and bond wires 1212 connect conductive features of the first semiconductor die 1206 to primary side patterned conductive features 112 of a transformer primary implemented by the transformer apparatus 100. In this example, the wire bonding interconnects leads 1204 associated with a DC input voltage to a primary-side switching device (e.g., a MOSFET), and the input signal and the switching device are connected to primary windings of the transformer apparatus 100.

One or more bond wires 1210 in this example connect conductive features of the second semiconductor die 1208 to corresponding low-voltage leads 1204. Bond wires 1216 connect conductive features of the second semiconductor die 1208 to patterned conductive features 111 and 113 of the transformer apparatus 100, for example, to interconnect rectifier diodes of the semiconductor die 1208 with first and second secondary winding circuits of the transformer apparatus 100. The product 1200 includes a molded package 1218 that encloses the dies 1206 and 1208 as well as the bond wires and the transformer apparatus 100. The package 1218 also encloses portions of the leads 1204, while leaving portions of the leads 1204 exposed for soldering to an external structure (e.g., a printed circuit board, not shown).

The inkjet printed magnetic ink epoxy 106 and 108 of the apparatus 100 advantageously facilitate manufacturing without the need for screen printing or masks, with ease of adjustment for different designs, and significantly reduced materials usage compared with screen printing techniques. Moreover, described examples advantageously reduce or mitigate non-magnetic material gaps between the lamination structure 104 and the magnetic core structures 101, 102. Moreover, direct inkjet printing of magnetic ink epoxy 106 and 108 allows accurate additive deposition and formation of fine pitch features, for example, with dimensional accuracies up to $+/-5$ μm in some implementations. Described examples combine the advantages of good high frequency performance and small package sizes, along with magnetic circuit performance improvements by reducing or eliminating non-magnetic material gaps, together with the material usage advantages of inkjet printing compared with screen printing approaches.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. An apparatus, comprising:
    a lamination structure, including a patterned conductive feature that forms a part of a passive electronic component;
    a core structure; and
    a magnetic adhesive layer that joins the core structure to the lamination structure.

2. The apparatus of claim 1, wherein the lamination structure includes a plurality of patterned conductive features.

3. The apparatus of claim 2, wherein:
    the magnetic adhesive layer joins the core structure to a first side of the lamination structure; and
    a second magnetic adhesive layer joins a second core structure to a second side of the lamination structure.

4. The apparatus of claim 3, wherein the lamination structure includes a plurality of patterned conductive layers.

5. The apparatus of claim 2, wherein the passive electronic component is a transformer, and wherein the lamination structure includes:
    a conductive primary winding; and
    a conductive secondary winding magnetically coupled with the conductive primary winding by the core structure and the magnetic adhesive layer.

6. The apparatus of claim 2, wherein the passive electronic component is an inductor, and wherein the lamination structure includes a conductive winding magnetically coupled with the core structure and the magnetic adhesive layer.

7. The apparatus of claim 2, wherein the passive electronic component is a capacitor, and wherein the lamination structure includes first and second capacitor plates.

8. The apparatus of claim 1, wherein:
the magnetic adhesive layer joins the core structure to a first side of the lamination structure; and
a second magnetic adhesive layer that joins a second magnetic core structure to a second side of the lamination structure.

9. The apparatus of claim 8, wherein the lamination structure includes a plurality of patterned conductive layers.

10. The apparatus of claim 1, wherein the lamination structure includes a plurality of patterned conductive layers.

11. The apparatus of claim 1, wherein the core structure includes a magnetic material.

12. A method, comprising:
performing an inkjet printing process that prints a magnetic ink epoxy on a magnetic core structure, or on a lamination structure; and
attaching the magnetic core structure to the lamination structure via the magnetic ink epoxy.

13. The method of claim 12, further comprising:
performing another inkjet printing process that prints a second magnetic ink epoxy on the lamination structure; and
attaching a second magnetic core structure to the lamination structure via the second magnetic ink epoxy.

14. The method of claim 13, wherein performing the other inkjet printing process includes performing the other inkjet printing process multiple times to print the second magnetic ink epoxy as a multilayer on the lamination structure.

15. The method of claim 14, wherein performing the inkjet printing process includes performing the inkjet printing process multiple times to print the magnetic ink epoxy as a multilayer on the magnetic core structure, or on the lamination structure.

16. The method of claim 12, wherein performing the inkjet printing process includes performing the inkjet printing process multiple times to print the magnetic ink epoxy as a multilayer on the magnetic core structure, or on the lamination structure.

17. A method, comprising:
formulating a magnetic ink epoxy with ferrite powders of different particle sizes;
performing an inkjet printing process that prints the magnetic ink epoxy on a magnetic core structure; and
attaching the magnetic core structure to a side of a lamination structure via the magnetic ink epoxy.

18. The method of claim 17, further comprising:
performing another inkjet printing process that prints a second magnetic ink epoxy on another side of the lamination structure; and
attaching a second magnetic core structure to the other side of the lamination structure via the second magnetic ink epoxy.

19. The method of claim 17, wherein performing the inkjet printing process includes performing the inkjet printing process multiple times to print the magnetic ink epoxy as a multilayer on the magnetic core structure.

20. The method of claim 17, wherein the magnetic ink epoxy is formulated with ferrite powders having particle sizes in the range of tens of nanometers to hundreds of nanometers.

21. A semiconductor product, comprising:
a semiconductor die; and
a magnetic apparatus, including:
a lamination structure, including a patterned conductive feature that forms a part of a passive electronic component,
a core structure, and
a magnetic adhesive layer that joins the core structure to the lamination structure.

22. A method for fabricating a semiconductor product, comprising:
performing an inkjet printing process that prints a magnetic ink epoxy on a magnetic core structure, or on a lamination structure;
attaching the magnetic core structure to the lamination structure via the magnetic ink epoxy;
electrically interconnecting conductive features of a semiconductor die, and conductive features of the magnetic lamination structure; and
enclosing the lamination structure and the magnetic core structure in a package structure.

23. The method of claim 22, further comprising:
electrically interconnecting further conductive features of the semiconductor die with leads of a lead frame structure; and
electrically interconnecting further conductive features of the magnetic lamination structure with further leads of the lead frame structure;
wherein enclosing the lamination structure and the magnetic core structure further includes enclosing a portion of the lead frame structure.

* * * * *